United States Patent
Barth

(10) Patent No.: US 6,693,343 B2
(45) Date of Patent: Feb. 17, 2004

(54) SELF-PASSIVATING CU LASER FUSE

(75) Inventor: Hans-Joachim Barth, Munich (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/751,554

(22) Filed: Dec. 28, 2000

(65) Prior Publication Data

US 2002/0084507 A1 Jul. 4, 2002

(51) Int. Cl.$^7$ .............................................. H01L 29/00
(52) U.S. Cl. ...................... 257/529; 257/209; 337/160; 438/601
(58) Field of Search ................. 257/209, 529; 337/152, 159, 160; 438/132, 281, 333, 467, 601

(56) References Cited

U.S. PATENT DOCUMENTS

| | | | | |
|---|---|---|---|---|
| 5,622,608 A | * | 4/1997 | Lanford et al. | 204/192.15 |
| 6,057,223 A | * | 5/2000 | Lanford et al. | 438/618 |
| 6,066,892 A | * | 5/2000 | Ding et al. | 257/751 |
| 6,111,301 A | * | 8/2000 | Stamper | 257/529 |
| 6,180,503 B1 | * | 1/2001 | Tzeng et al. | 438/601 |
| 6,249,055 B1 | * | 6/2001 | Dubin | 257/758 |
| 6,295,721 B1 | * | 10/2001 | Tsai | 29/623 |
| 2001/0042897 A1 | * | 11/2001 | Yeh et al. | 257/529 |

* cited by examiner

Primary Examiner—George Eckert
(74) Attorney, Agent, or Firm—Slater & Matsil, L.L.P.

(57) ABSTRACT

In an integrated circuit structure, the improvement comprising a self-passivating Cu-laser fuse characterized by resistance to oxidation and corrosion and improved adhesion in the interface between Cu and metallization lines and Cu and a dielectric cap subsequent to blowing the fuse by an energizing laser, the fuse comprising:

a metallization-line;

a liner separating the metallization line and a combination Cu-alloy seed layer and a pure Cu layer;

a dielectric surrounding the liner; and a dielectric cap disposed over the surrounding dielectric, the liner and the combination Cu-alloy seed layer and pure Cu layer; the laser fuse being characterized after Laser energizing by passivation areas:

a) on the open Cu-fuse surface; and
b) in the interfaces between:
  (i) the Cu-alloy seed layer and the liners and dielectric; and
  (ii) between the pure Cu layer and the dielectric cap.

6 Claims, 1 Drawing Sheet

SELF-PASSIVATING CU LASER FUSE

BACKGROUND OF THE INVENTION

1. Field of the Invention

The invention relates to self-passivating Cu laser fuses in an integrated circuit or semiconductor device prepared by using Cu-alloys and annealing steps to provide Cu/low k integration schemes. These self-passivating Cu materials may also be used in Cu-to-Cu wire bonding.

2. Description of Related Art

In the art of laser fuses used as a portion of a semiconductor, the state of the art is to use fuses of pure Cu; however, under this usage the fuses are very sensitive to corrosion and oxidation as soon as the fuse is blown and the Cu is exposed to the atmosphere.

Nevertheless, in Cu-oxide integration schemes it is possible to get around the aforementioned problem by innovative layout and design of the fuse (i.e. ending the fuse on top of W-bars and containing the Cu oxidation and corrosion in the Cu-features of the fuse).

This innovative layout and design approach is not feasible in Cu/low k metallizations because of the high diffusivity of moisture and oxygen in the typical low k field, for the reason that corrosion of the Cu fuse would proceed to adjacent Cu wirings due to poor liner integrity at the sidewalls of damascene features.

An alternative to the state of art approach in lieu of using pure Cu (which is very sensitive to corrosion plus oxidation as soon as the fuse is blown and Cu is exposed to the atmosphere), is the use of Al-fuses on top of a Cu-metallization. However, this alternative approach is expensive because it requires many additional steps in the manufacturing process.

U.S. Pat. No. 5,747,868 disclose a laser fusible link structure for semiconductor devices comprising: a plurality of laser fusible links, each fusible link having a link length extending along a length direction and a link width extending along a width direction; a first dielectric layer conformally covering the laser fusible links; for each laser fusible link, an etch mask member disposed on the first dielectric layer vertically aligned over its respective laser fusible link, each etch mask member having a mask length extending in the length direction and a mask width extending in the width direction, the mask width being greater than or equal to the link width of its respective fusible link and less than or equal to the minimum spot size of the laser; and the etch mask members extending beyond the window perimeter in the length direction, the window perimeter extending beyond the etch mask members in the width direction.

A laser fuse structure formed over an active circuitry of an integrated circuit is disclosed in U.S. Pat. No. 5,986,319. The integrated circuit comprises: active circuitry; a first insulating layer, the first insulating layer overlying the active circuitry; a metal fuse layer above the first insulating layer, the metal fuse layer including at least one fuse, the at least one fuse being a radiant-energy configurable fuse having a location such that the beam area of the radiant energy used to configure the at least one fuse overlaps the active circuitry; a first multi-metal protective layer underneath the at least one fuse, the first multi-metal protective layer sufficiently large to shield the active circuitry from the radiant energy not directly impinging upon the at least one fuse; a second insulating layer between the first multi-metal protective layer, and the at least one fuse; a second multi-metal protective layer underneath the first multi-metal protective layer, the first and second multi-metal protective layers being sufficiently large to shield the active circuitry from the radiant energy not directly impinging on the at least one fuse; and a third insulating layer on the second multi-metal protective layer, the third insulating layer disposed between the first and second multi-metal protective layer.

U.S. Pat. No. 5,622,608 disclose a process for preparing an oxidation resistant, electrically conductive Cu layer on a substrate, and subsequently annealing. The annealing step is believed to provide a metal oxide layer at the surface of the Cu layer upon annealing.

Passivated Cu conductive layers for microelectronic applications is disclosed in U.S. Pat. No. 6,057,223, in which the Cu conductors formed are included as a component in a microelectronic device. The conductor is formed by forming a metal layer on the surface of a microelectronic substrate, forming a Cu layer on the metal layer, and annealing the metal and Cu layers. The annealing step is believed to diffuse some of the metal layer through the Cu layer to the surface where the diffused metal forms a protective metal oxide at the surEace of the Cu layer. As a result, the metal oxide layer passivates the Cu layer.

In the semiconductor manufacturing art in which a laser fuse is made a portion of the semiconductor as an effective way to alter the operation of semiconductor devices after the device has been fabricated to provide implementing redundancy schemes to replace defective portions of an integrated circuit with redundant portions, there is a need in the case of Cu laser fuses to prevent corrosion and oxidation as soon as the fuse is blown by laser energy and the Cu is exposed to the atmosphere.

SUMMARY OF THE INVENTION

One object of the present invention is to provide a semiconductor device with a laser fuse portion comprising copper, in which the copper is not susceptible to corrosion as soon as the fuse is blown during energizing by a laser.

Another object of the present invention is to provide a semiconductor device with a laser fuse portion comprising copper, in which the copper is not subject to oxidation as soon as the fuse is blown by laser energy and the copper is exposed to the atmosphere.

A further object of the present invention is to provide a semiconductor device with a laser fuse portion comprising copper without the need of ending the fuse on top of W-bars to contain Cu oxidation and corrosion in the Cu-features, when the fuse is blown by laser energy and Cu is exposed to the atmosphere.

A still further object of the present invention is to provide a semiconductor device with a laser fuse portion that comprises Cu/low k metallizations in which corrosion of the Cu-fuse would normally proceed to adjacent Cu wirings (due to poor liner integrity at the sidewalls of damascene features) are made to resist corrosion and oxidation of the Cu-fuse upon subjection to laser energy.

In accordance with the invention, prevention of corrosion and oxidation of the Cu laser fuse portion of a semiconductor as soon as the fuse is blown by laser energy is avoided by passivating a Cu-alloy between the liner and a dielectric cap subsequent to an application of laser energy to break or blow the fuse, by an annealing step to provide a self-passivating dopant rich layer on top of the open Cu-laser fuse area and at the Cu-interfaces to surrounding metallic liners and dielectric diffusion barriers.

BRIEF DESCRIPTION OF THE DRAWING FIGURES

DETAILED DESCRIPTION OF PREFERRED EMBODIMENTS

In general, in the context of the invention, the laser fuse component comprising Cu of the semiconductor device is prepared by the following process sequence: 1) patterning a (Dual-) Damascene structure in the dielectric to form a fuse; 2) depositing a metallic liner (PVD, CVD, electroless, etc.; this step may be optional by using the optimum Cu-alloy); 3) depositing of a seed-layer of a Cu-alloy for final Cu-fill (PVD or CVD or other art known methods); 4) filling the damascene structure with pure Cu (electroplating, CVD, electroless, PVD or other art known methods); 5) pre-CMP annealing at low temperatures (<200° C.), to form a low resistive Cu film (larger Cu grains); however, the out-diffusion of the dopants in the Cu-alloy should still be suppressed at this point; 6) Cu-CMP to remove the Cu-overfill, followed by the liner CMP; 7) depositing of a dielectric cap layer (Cu diffusion barrier, Si-Nitride, Blok or other art known method); 8) depositing a final passivation layer (oxide/nitride or combinations) or other dielectric layers known in the art; 9) depositing a polyimide or photo-sensitive polyimide (PSP) layer (optional); 10) thinning of the dielectric cap layer or final passivation layer on top of the laser fuse by using known lithographic+etch processes; 11) laser fusing of the metal fuse (during the fusing process a crater is formed in the near surrounding area of the blown Cu fuse; the two ends of the Cu fuse are now exposed to the atmosphere); and 12) annealing the bonded chips at temperatures between 250° C.–450° C. (in inert atmosphere) to form a self-passivating layer on the open Cu-fuse surface and also on the interfaces to metallic liners and/or dielectric cap layers; the self-passivating layer protecting the open ends and the embedded parts of the Cu fuse from oxidation and corrosion.

Figure 1:
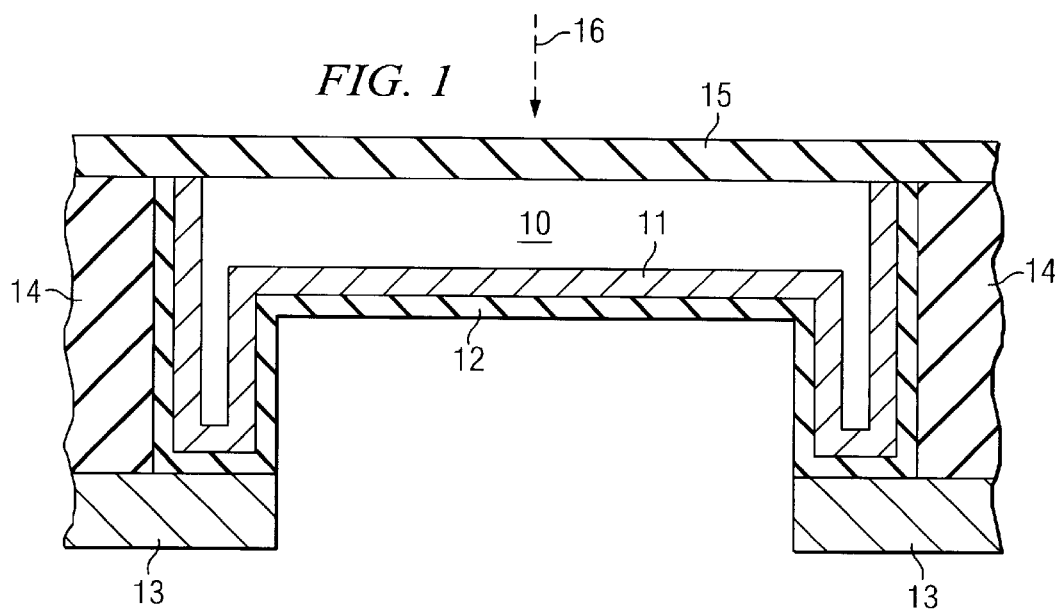
FIG. 1 is drawing of a semiconductor device comprising a laser fuse component comprising a copper alloy.

Reference is now made to FIG. 1, which shows a semiconductor device comprising a Cu-laser-fuse 10, composed of a Cu-alloy 11 disposed above a liner 12, which is bounded by a metal-line 13. The Cu-laser-fuse is disposed between a dielectric 14 and a dielectric cap 15. The intended laser energy 16 for blowing the fuse has not yet been applied.

Figure 2:
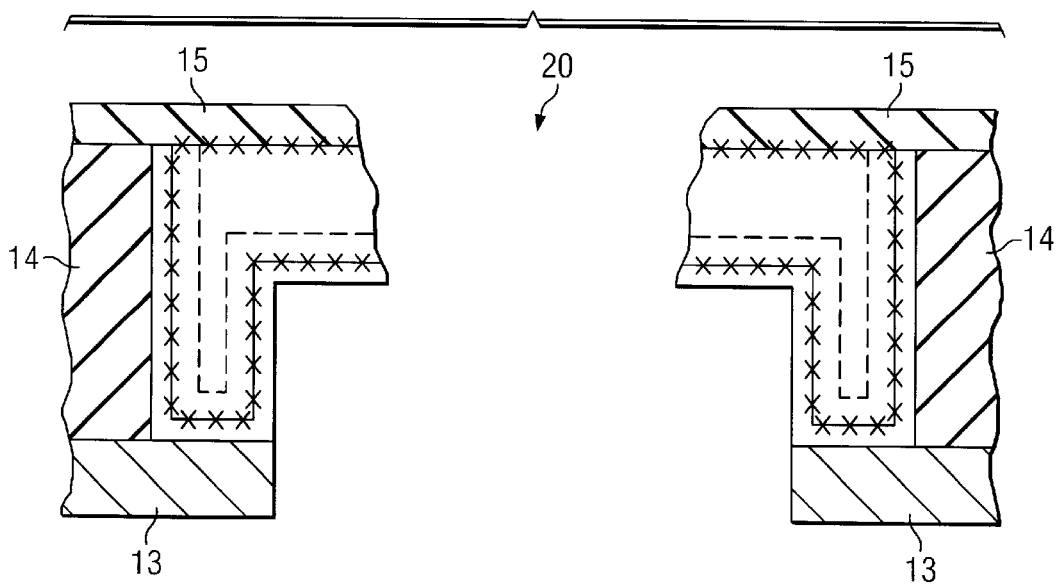
FIG. 2 shows a semiconductor device of the invention comprising a passivated laser fuse component formed by subjecting Cu-alloy of the blown fuse to an annealing step to form a self-passivated Cu-surface and interface to the metal liner and dielectric cap layer to prevent corrosion and oxidation.

As may be seen from FIG. 2, after the Cu-alloy laser fuse is blown by the energizing laser, a fuse crater 20 is formed, and thereafter an anneal is performed to create a self-passivating dopant rich layer on top of the opened Cu-laser fuse areas and at the Cu interfaces to the surrounding metal-liners and dielectric diffusion barriers. The self-passivated dopant rich Cu-interface to the surrounding metal-liner and dielectric diffusion barriers is designated by the X's, and within the confines of the borders defined by the X's, is the Cu 16. This dopant rich self-passivating layer is free from hillock structures and protects the Cu from corrosion, oxidation and the outdiffusion of Cu into semiconductor device areas.

In general, the Cu-alloys may be Cu—Al, Cu—Mg, Cu—Li, as well as other well-known Cu-alloys, and the concentration of the non-Cu doping material from the other component of the Cu-alloy will range from about 0.1 to about 5.0% by weight of the Cu-alloy.

This self-passivating Cu-fuse is especially important when employed in Cu/low k integration schemes and in Cu-to-Cu-wire bonding.

In the current state of the art where pure Cu is used, and wherein the Cu is very susceptible to corrosion and oxidation as soon as the fuse is blown and copper is exposed to the atmosphere, the Cu-oxide integration schemes may be circumvented or gotten around by utilizing a clever layout and design of the fuse (i.e. ending the fuse on top of W-bars and thereby containing the Cu oxidation and corrosion in the Cu-features of the fuse). However, this design around layout approach would not be available in Cu/low k-metallizations because of the high diffusivity of moisture and oxygen in the typical low k materials.

Further, in the typical Cu/low k-metallizations, the corrosion of the Cu-fuse proceeds to adjacent Cu wirings, because of poor liner integrity at the sidewalls of damascene features.

Although certain representative embodiments and details have been shown for purposes of illustrating the preferred embodiments of the invention, it will be apparent to those skilled in the art that various changes in the invention disclosed may be made without departing from the scope of the invention, which is defined in the appended claims.

What is claimed is:

1. In an integrated circuit structure, the improvement comprising a self-passivating Cu-laser fuse characterized by resistance to oxidation and corrosion and improved adhesion in the interface between Cu and metallization lines and Cu and a dielectric cap, subsequent to blowing the fuse by an energizing laser, said fuse comprising:

a) a metallization-line;

b) a liner separating said metallization line and a combination Cu-alloy seed layer and pure Cu layer;

c) a dielectric surrounding said liner; and d) a dielectric cap disposed over said surrounding dielectric, said liner and said combination Cu-alloy seed layer and pure Cu layer; and e) a passivation layer of oxide, nitride or combinations of nitrides deposited on said cap layer that has been annealed at a temperature of from about 250° C. to about 450° C.;

said laser fuse being characterized after laser energizing by passivation areas;

f) on the open Cu-fuse surface; and g) in the interfaces between:
      (i) said Cu-alloy seed layer and said liners and dielectric; and
      (ii) between said pure Cu layer and said dielectric cap.

2. The structure of claim 1 wherein dopant in said passivation areas is present in a range of from about 0.1 to about 5.0% by weight of said Cu-alloy.

3. The structure of claim 2 wherein said Cu-alloy is selected from the group consisting of Cu—Al, Cu—Mg and Cu—Li.

4. The structure of claim 3 wherein said Cu-alloy is Cu—Al.

5. The structure of claim 3 wherein said Cu-alloy is Cu—Mg.

6. The structure of claim 3 wherein said Cu-alloy is Cu—Li.

* * * * *